US005578412A

United States Patent [19]
Held et al.

[11] Patent Number: 5,578,412
[45] Date of Patent: Nov. 26, 1996

[54] PHOTOSENSITIVE FILMS HAVING A THERMALLY SENSITIVE MATERIAL CONTAINING LAYER AND PROCESS FOR USING THE SAME

[75] Inventors: Robert P. Held, Newark, Del.; Massimo Pizzocri, Schwalbach-TS, Germany; Harvey W. Taylor, Sayre, Pa.

[73] Assignee: E. I. DuPont de Nemours and Company, Wilmington, Del.

[21] Appl. No.: 359,667

[22] Filed: Dec. 20, 1994

[51] Int. Cl.$^6$ .................................. G03C 11/12
[52] U.S. Cl. .................. 430/257; 430/258; 430/259; 430/292; 430/293
[58] Field of Search ............... 430/257, 258, 430/259, 432, 357, 252, 253, 256, 292, 293

[56] References Cited

U.S. PATENT DOCUMENTS

| | | | |
|---|---|---|---|
| 3,649,268 | 3/1972 | Chu et al. | 96/27 B |
| 3,854,950 | 12/1974 | Held | 96/82 |
| 4,162,162 | 7/1979 | Dueber | 96/115 I |
| 4,349,620 | 9/1982 | Cyr et al. | 430/259 |
| 4,356,253 | 10/1982 | Buzzell | 430/291 |
| 4,461,823 | 7/1984 | Held | 430/120 |
| 4,650,738 | 3/1987 | Platzer et al. | 430/143 |
| 4,716,093 | 12/1987 | Kempf | 430/277 |
| 4,719,169 | 1/1988 | Platzer et al. | 430/258 |
| 4,808,508 | 2/1989 | Platzer | 430/143 |
| 4,859,551 | 8/1989 | Kempf | 430/49 |
| 4,889,787 | 12/1989 | Musser | 430/166 |
| 4,902,594 | 2/1990 | Platzer | 430/258 |
| 4,910,120 | 3/1990 | Platzer et al. | 430/253 |
| 4,948,693 | 8/1990 | Shadrach et al. | 430/143 |
| 5,049,476 | 9/1991 | Platzer | 430/253 |
| 5,053,310 | 10/1991 | Platzer | 430/162 |
| 5,100,757 | 3/1992 | Platzer et al. | 430/257 |
| 5,176,973 | 1/1993 | Gifford et al. | 430/15 |
| 5,236,806 | 8/1993 | Platzer | 430/253 |
| 5,248,583 | 9/1993 | Lundquist et al. | 430/263 |
| 5,443,937 | 8/1995 | Bodager et al. | 430/143 |

FOREIGN PATENT DOCUMENTS

| | | |
|---|---|---|
| 1255956 | 6/1989 | Canada . |
| 2000712 | 10/1989 | Canada . |
| 2019058 | 6/1990 | Canada . |
| 0291537A1 | 11/1987 | European Pat. Off. . |
| 0503402A1 | 2/1992 | European Pat. Off. . |
| 556732 | 8/1993 | European Pat. Off. . |
| 0556731 | 8/1993 | European Pat. Off. . |
| 0601760A2 | 11/1993 | European Pat. Off. . |
| 3941446 | 12/1990 | Germany . |
| 4204950A1 | 2/1992 | Germany . |
| 1-179039 | 7/1989 | Japan . |
| 3-288852 | 12/1991 | Japan . |
| 6-64348 | 3/1994 | Japan . |
| 2144867 | 3/1985 | United Kingdom . |
| WO93/03928 | 8/1992 | WIPO . |

OTHER PUBLICATIONS

Improved Colour Proofing Process Involving Dry Transfer Steps, Research Disclosure/Dec. 1993, No. 35642, pp. 802–804.
Abstract, DE 407390–A, Sep. 10, 1992.

*Primary Examiner*—Geraldine Letscher

[57] ABSTRACT

A photosensitive element comprising, in order a support; a photosensitive layer comprising a photosensitive composition; and a layer comprising a thermally sensitive material; wherein the thermally sensitive material is (a) incompatible with the photosensitive composition, (b) non-tacky and non-blocking at room temperature, and (c) tackifiable at 70° C. to 120° C. and a process for using these elements is described. The photosensitive element may be in sheet or roll form.

4 Claims, No Drawings

PHOTOSENSITIVE FILMS HAVING A THERMALLY SENSITIVE MATERIAL CONTAINING LAYER AND PROCESS FOR USING THE SAME

FIELD OF THE INVENTION

This invention relates to photosensitive films, and in particular to photosensitive films that are useful in a sheet laminator.

BACKGROUND OF THE INVENTION

Photosensitive elements which can be used in image reproduction processes are well known in the graphics arts industry. Such elements which may be positive or negative-working elements usually comprise a support, a photosensitive layer and a cover sheet. The photosensitive layer is generally tacky prior to exposure. The positive-working photopolymerizable elements are exposed imagewise through an image bearing transparency to form an image having tacky and non-tacky areas. Negative-working photosensitive elements are also known which require a dual exposure to provide a negative image with tacky and non-tacky areas.

Such photosensitive elements are widely used in off-press color proofing to simulate the images produced by printing. In a surprint proof, all the colored images are superimposed, by, for example, multiple exposure, lamination or transfer, onto a single support. Unlike an overlay proof, the colored images cannot be separated and viewed individually.

Chu and Cohen, U.S. Pat. No. 3,649,268 describe a reproduction process using positive-working photopolymerizable elements. The image is developed by toning with a suitable toner which desirably adheres only to the tacky image areas. Excess toner which may be present is removed from the non-tacky areas to provide, for example, an image which is a proof of the original or which can be used to transfer the image to another surface. Multicolor proofs can be made as well.

The photosensitive elements used to make multicolor proofs are generally in roll form. In making a four color proof, comprising cyan, magenta, yellow and black, four different roll laminators are required for the lamination step. This adds cost to the process. If a sheet laminator could be used, only one laminator would be required to make a four color proof. The problem with some known photosensitive elements is that once the cover sheet is removed exposing the tacky photosensitive layer, the photosensitive layer on the support cannot be fed through a sheet laminator.

A need exists for a photosensitive element that has a surface that is non-tacky at room temperature and becomes tacky or softenable upon the application of heat. These elements would be capable of being fed through a sheet laminator eliminating the need for four separate laminators and thus reducing the cost of making a four color proof. Also, the element may be rolled into a roll without the need for a cover sheet further reducing costs.

SUMMARY OF THE INVENTION

In accordance with this invention there is provided a photosensitive element comprising, in order:

(a) a support;
(b) a photosensitive layer comprising a photosensitive composition; and
(c) a layer comprising a thermally sensitive material; wherein the thermally sensitive material is incompatible with the photosensitive composition, non-tacky, softenable and non-blocking at room temperature, and tackifiable at 70° C. to 120° C.

The thermally sensitive material may be an adhesive, a non-solvent soluble, extruded film, or an extruded film having a thermally sensitive, non-blocking adhesive coating adhered to the side away from the photosensitive coating. The photosensitive layer may comprise a positive-working, photopolymerizable composition, a dual-exposure, negative-working photosensitive composition or an aqueous or solvent developable photosensitive composition. These elements are useful in making proofs, and are particularly useful in making four color proofs. The photosensitive elements may also be useful in preparing printed circuit boards.

In another embodiment of the invention there is disclosed a process for forming a colored image on a receptor surface by:

(i) laminating to a receptor surface a photopolymerizable element comprising:
  (a) a support;
  (b) a photosensitive layer comprising a photosensitive composition; and
  (c) a layer comprising a thermally sensitive material; wherein the thermally sensitive material is incompatible with the photosensitive composition, non-tacky, softenable and non-blocking at room temperature, and tackifiable at 70° C. to 120° C.;
to form a laminated structure having the layer comprising a thermally sensitive material contiguous to the receptor surface, wherein the adhesion of the support to the photosensitive layer is less than the adhesion of the receptor surface to the layer comprising a thermally sensitive material;

(ii) exposing the layer imagewise through the support to actinic radiation to form imaged and non-imaged areas;

(iii) removing the support without transfer thereto of either imaged or non-imaged areas of the photosensitive layer; and (iv) developing the photosensitive layer having thereon imaged and non-imaged areas to form a colored image on the receptor surface.

Multicolored images may be formed by repeating steps (i) to (iv), at least once, preferably three times, using the colored image containing receptor as the receptor surface and different photosensitive elements in step (i), and appropriate separations and developing tools in subsequent steps. One method of developing is by using dry toners.

DETAILED DESCRIPTION OF THE INVENTION

The photosensitive element of the invention comprises, in order, a support; a photosensitive layer comprising a photosensitive composition; and a layer comprising a thermally sensitive material which may be (a) an adhesive, (b) a non-solvent soluble, extruded film, or (c) an extruded film having a thermally sensitive, non-blocking adhesive coating adhered to the side away from the photosensitive coating.

SUPPORT

Any material that can withstand the temperature used to tackify the thermally sensitive material is suitable as a support. Typically supports are films that are smooth and flat. The support may have low oxygen permeability and should be thermally stable in the range of operating temperatures. Some examples of suitable supports include polymeric films such as polyesters, including polyethylene terephthalate and polyethylene naphthanate; polyamides; polycarbonates; fluoropolymers; polyacetals; polyolefins; etc. The support can also be a thin metal sheet, a paper substrate, or synthetic paper which has been treated to be water resistant. The support is preferably transparent since exposure of the photosensitive layer generally takes place through the support. The support may be treated, for example, by electric discharge treatment to improve its adhesion to the photosensitive layer. A preferred support material is polyethylene terephthalate. The support is preferably 6 to 50.8 microns thick, and more preferably 6 to 19 microns thick.

PHOTOSENSITIVE LAYER

The photosensitive layer may comprise a positive-working photopolymerizable composition, a negative-working, dual exposure photosensitive composition or an aqueous or solvent developable photosensitive composition.

The positive-working photopolymerizable composition generally comprises a compound having at least one ethylenically unsaturated group, a binder and a photoinitiator. Other ingredients may be present to enhance the properties of the composition. Such ingredients include optical brighteners, ultraviolet radiation absorbing materials, plasticizers, thermal stabilizers, hydrogen doners, etc. Suitable photopolymerizable compositions and their process of use are disclosed in U.S. Pat. Nos. 4,356,253 and 3,854,950, the disclosures of which are incorporated by reference.

The negative-working, dual exposure photosensitive composition generally comprises a compound having at least one ethylenically unsaturated group, a binder, a photoinitiator, a photoinhibitor, and at least one visible sensitizer. Suitable negative-working, dual exposure photosensitive compositions and their process of use are disclosed in U.S. Pat. Nos. 4,162,162 and 4,859,551, the disclosures of which are incorporated by reference.

The aqueous or solvent developable photosensitive composition typically comprises a compound having at least one ethylenically unsaturated group or crosslinkable group, a binder and optionally a photoinitiator. Suitable aqueous developable photosensitive compositions are disclosed in Assignee's U.S. Ser. No. 08/277,850 filed Jul. 20, 1994 which discloses a photosensitive diazo resin and a polyvinyl alcohol binder; U.S. Ser. No. 08/100,222 filed Aug. 2, 1993 which discloses derivatives of polyvinyl alcohol having crosslinkable groups such as the cinnamyl, chalcone, α-phenyl-maleimide, N-alkyl styrylpyridinium and N-alkyl styrylquinolinium groups; and UK Patent publication 2,144,867 B which discloses an aqueously developable precolored layer containing a colorant. Suitable solvent developable photosensitive layers are disclosed in U.S. Pat. Nos. 4,716,093 and 4,349,620 issued Dec. 29, 1987 and Sep. 14, 1982, respectively. These publications and applications also disclose the processes for using these films.

The photosensitive layer has a thickness of about 2.54 microns to 18 microns, and preferably between about 2.54 to 10 microns.

THERMALLY SENSITIVE MATERIAL CONTAINING LAYER

The thermally sensitive material containing layer comprises a thermally sensitive material which may be an adhesive or a non-solvent soluble, extruded film with or without a thermally sensitive adhesive coating thereon. It may contain other ingredients such as UV light absorbers, antihalation dyes which may be photobleachable, plasticizers, waxes, fillers, stabilizers, and antioxidants, etc. The thermally sensitive material is incompatible with the photosensitive composition, non-tacky and non-blocking at room temperature, and tackifiable or softenable at 70° to 120° C.

By "incompatible" with the photosensitive composition, it is meant that the thermally sensitive material does not migrate into the photosensitive composition causing the photosensitive layer to become essentially inactive. By "non-tacky and non-blocking" at room temperature, it is meant that the surface can be placed against another surface without sticking to it or if slight sticking occurs, no damage or marring of the surface results. The thermally sensitive material is tackifiable or softenable at 70° to 120° C., and preferably 80° to 120° C. By "non-solvent soluble" it is meant that the extruded integral film does not dissolve in common organic casting solvents such as alcohols, ketones, chlorinated hydrocarbons (except polycarbonate), aromatic and non-aromatic hydrocarbons. The non-solvent list does not include items like concentrated acidic/basic media, tetrahydrofuran (which attacks polyester), hexamethylphosphoramide and dimethylformamide.

When the thermally sensitive material is an adhesive, it is selected from the group consisting of hydrocarbon-based adhesives such as ethylene copolymers, hot melt type adhesives such as ethyl vinyl acetate with or without waxes, ethylene-ethylacrylate copolymers, polyvinylbutyral, polyamide and polyester resins, low molecular weight polyethylene and amorphous polypropylene polymers, certain vinyl ethers and poly(acrylate) esters, rubber type thermally sensitive materials such as block copolymers of styrene-butadiene or styrene isoprene such as Kraton® thermoplastic rubber polymers, etc. The adhesive may be present in the amount of 50 to 100%, preferably 80 to 100%, based on the total weight of layer (C).

When the thermally sensitive material is a non-solvent soluble, extruded film it may be selected from the group consisting of polyvinylidene chloride (Saran®), polyolefins and polyamides. These extruded films, along with polyesters and polycarbonates, etc., may have a thermally sensitive non-blocking, heat activatable adhesive coating on the side away from the photosensitive layer as the thermally sensitive material. Other useful thermally sensitive adhesives and films may be found in the "Handbook Of Adhesives", Second Edition, Edited by Irving Skeist, Van Nostrand Reinhold Company, 1977.

The thickness of the thermally sensitive material containing layer comprising a thermally sensitive material is 3 to 50 microns thick, preferably 6 to 30 microns thick.

Additives:

UV light absorbers, antihalation dyes which may be photobleachable, plasticizers, waxes, fillers, stabilizers, and antioxidants may be used in the thermally sensitive material containing layer. Some useful UV light absorbers are disclosed in U.S. Pat. No. 3,854,950 issued Dec. 17, 1974. Some useful plasticizers include tricresyl phosphate, dioctyl isophthalate, di-(2-ethylhexyl) adipate, etc. Inorganic fillers and colorless pigments may used in hot melt adhesive containing layers. Some classes of useful antioxidants include butylated hydroxy toluene, other hindered phenol moieties, zinc, thiocarbamates, bis-phenolic phosphites, hindered amines, etc.

PROCESS OF PREPARATION

The photosensitive element is prepared by any known technique known to those skilled in the art. The photosensitive layer is applied, preferably coated, using any conventional coating apparatus, onto a support, preferably polyethylene terephthalate, followed by drying at about 25° C. to 120° C., preferably 75° C. to 85° C. for 1 to 30 minutes, preferably 1 to 5 minutes. The layer containing the thermally sensitive material is then applied, preferably laminated, to the dried photosensitive coating. When the thermally sensitive material is an adhesive, the layer is preferably coated onto the photosensitive layer using a conventional coating apparatus and dried. When the thermally sensitive material is a non-solvent soluble extruded film, the film is preferably laminated to the photosensitive layer. When the extruded film has a thermally sensitive non-blocking, heat activatable adhesive coating on the side away from the photosensitive layer, the same lamination process may also be used. The thickness of the adhesive on the extruded film may be from 1–25 microns, and preferably 3–12 microns.

PROCESS OF USE

The photosensitive layer thickness can vary according to the composition and the material used as receptor. The number of layers of photopolymer in the laminated final product is dependent upon the image being reproduced, the desired quality of the final product and uses made of the final product.

The above-described photopolymerizable elements are useful in the imaging process described in Chu et al., U.S. Pat. No. 3,649,268. The photosensitive element is laminated to a receptor surface. The receptor is a material that adheres strongly to the photosensitive layer. Almost any material, e.g., paper, polymer film, plastic, metal, ceramic, glass, etc. makes a suitable receptor. The only prerequisites for a receptor are that the adhesion between the receptor and the layer containing the thermally sensitive material be greater than the adhesion between the photosensitive layer and the support, and that the receptor be stable at the operating temperatures.

After lamination, the exposure of the photopolymerizable element may be through line or halftone positive transparencies. The transparency and the element generally are in operative contact during the exposure which may be made through either side in the case of an element that has transparent support and receptor. Preferably the element is exposed through the support.

Since most of the photosensitive materials preferred in this invention exhibit their maximum sensitivity in the ultraviolet range, the light source should furnish an effective amount of this radiation. Such sources include carbon arcs, mercury-vapor arcs, fluorescent lamps with special ultraviolet-emitting phosphors, argon glow lamps, electronic flash units and photographic flood lamps. The amount of exposure required for satisfactory reproduction of a given element is a function of exposure time, type of light source and distance between light source and element.

After imagewise exposure, the photosensitive element having imaged and non-imaged areas is developed, preferably by toning with a dry toner. The dry toners are preferably applied at room temperature, but elevated temperatures may be used if required. Alternatively, the photosensitive element, after imagewise exposure, may be developed with an aqueous or solvent developer.

In making a multi-color image on the receptor, the step of lamination, exposing and developing are repeated at least once, preferably three times, with the colored image containing receptor from the development step as the receptor surface and a different photosensitive element in the lamination step, and a different separation or transparency and a different developer, if developing using a dry toner in subsequent steps.

The invention now will be further illustrated, but not limited, by the examples.

EXAMPLES

Example 1

The following element was prepared:

A photopolymerizable layer as described in Example 1 of U.S. Pat. No. 4,461,823, was coated onto 12.7 micron thick polyethylene terephthlate (PET) film at a coating thickness of approximately 7.6 microns. A hot melt layer comprising a polyethylene-vinylacetate copolymer, Elvax® 260, E. I. DuPont de Nemours and Co., Wilmington, Del. and paraffin Atlantic No. 1116, Atlantic Oil Co., at a ratio of about 20% by weight of Elvax® to wax, was coated at a coating weight of approximately 7 microns on a silicone coated PET film. The hot melt layer was then laminated onto the photopolymerizable layer. The silicone coated PET film was peeled off and discarded, resulting in an integral structure comprising the 12.7 micron thick PET, photopolymerizable layer and hot melt layer.

The hot melt layer of the integral structure was then placed against a paper receptor sheet (Kromecote® cast coated enamel paper, Champion paper Co.). The sheet was heated in a dry mounting press at 120° C. for 5 seconds to adhere the integral structure to the paper. The photopolymerizable layer was then imaged as in Example 1 of U.S. Pat. No. 4,461,823 for 10 seconds through a silver halide transparency film. After removing the PET cover sheet, the image was toned with a cyan Cromalin® toner. The original image was reproduced.

The entire process was repeated sequentially three more times, i.e. the steps of lamination of polyethylene vinyl acetate copolymer, lamination of a different photosensitive element, exposure through the respective separation and toning with the respective colored toner, to yield a four-color proof. The proof was protected by laminating and blanket exposing an additional layer of the photosensitive composition.

Example 2

Example 1 was repeated with the following exception: the ionomer copolymer Elvax® 4310 was used as the hot melt layer. The results were the same as in Example 1.
Control 1:
Example 1 was repeated with the following exception: Elvax® 40 was used as the hot melt layer. There was no image after application of toner. This illustrates that when there is comparability between the liquid components in the photopolymerizable layer and the hot melt layer the resultant loss of tackifier in the photopolymerizable layer yields no image.

Example 3

A four color proof was assembled by laminating a 12 micron thick polyvinylidine chloride (Saran) extruded film to a Cromalin® CRS-3 paper receptor (E. I. du Pont de Nemours and Co., Wilmington, Del.) at 400 mm/min, 120° C., and 2000 newtons (~400 pli). A layer of photosensitive composition, similar to that disclosed in U.S. Pat. No.

3,854,950, on a polyethylene terephthalate support was laminated to the polyvinylidene chloride layer and exposed from the polyester support side, through a yellow positive separation in a 5 KW Theimer-Montakop vacuum frame for 18 seconds after a 2 minute drawdown. After exposure and removal of the polyester support, the unexposed tacky areas of the photosensitive composition were toned with a yellow positive Cromalin® toner to yield a yellow image. The entire process was repeated sequentially three more times, i.e. the steps of lamination of polyvinylidene choride film, lamination of a different photosensitive element, exposure through the respective separation and toning with the respective colored toner, to yield a four-color proof. The proof was protected by laminating and blanket exposing an additional layer of the photosensitive composition.

Example 4

A photosensitive composition, similar to that disclosed in U.S. Pat. No. 3,854,950, is coated on 48S Mylar® polyester film (DuPont), dried at 80° C. and is laminated at roll temperatures of 120° C., pressure loadings of 2000 newtons and a throughput speed of 400 mm/min. to a polypropylene film having thereon, a 8 micron thick ethylene-polyvinylacetate hot melt adhesive layer on its side away from the photosensitive composition. The resulting laminate will have in order, the following components: hot melt adhesive layer, polypropylene film, photosensitive layer, and Mylar® polyester film. The ethylene-polyvinylacetate hot melt adhesive is non-blocking; but tackifiable at the lamination temperature of 120° C.

The photosensitive element described above is laminated to a paper receptor (CRS-1) with the hot melt adhesive layer adhering to the receptor. The photosensitive element is exposed from the Mylar® polyester film support side through a yellow positive separation, for 18 seconds, in a 5 Kw Theimer-Montakop unit, Siegfried Theimer, W. Germany. The element is removed from the vacuum frame, the 48S support peeled away, and the unexposed, tacky photosensitive composition is hand toned with yellow Cromalin® positive toner.

The process is sequentially repeated by laminating additional photosensitive elements similar to that described above; exposing using the magenta, cyan and black separations; removing the support and toning with the respective colored toners to yield a four-color positive proof. An extra layer of the photosensitive material is applied and blanket exposed to provide a protective coversheet to the proof.

What is claimed is:

1. A process for preparing a colored image on a receptor surface comprising the steps of:
   (i) laminating to a receptor surface a photopolymerizable element, comprising, in order:
      (a) a support;
      (b) an uncolored photosensitive layer comprising a photosensitive composition; and
      (c) a layer comprising a thermally sensitive material; wherein the thermally sensitive material is (i) incompatible with the photosensitive composition, (ii) non-tacky and non-blocking at room temperature, and (iii) tackifiable at 70° C. to 120° C.;
   wherein layer (c) is in intimate contact with the receptor such that layer (c) adheres to said receptor;
   (ii) imagewise exposing the photopolymerizable element through a transparency and through the support, to actinic radiation to form exposed, non-tacky areas and unexposed, tacky areas on the photosensitive layer;
   (iii) removing the support;
   (iv) developing the photosensitive layer using a dry developer to form a colored image on the receptor surface.

2. The process of claim 1 wherein steps (i) and (iv) are repeated, at least once, using the colored image containing receptor from step (iv) as the receptor surface and a different transparency in step ii and the same or different developer in subsequent steps.

3. The process of claim 1 wherein the photosensitive element is a positive-working, photopolymerizable composition.

4. A process for preparing a colored image on a receptor surface comprising the steps of:
   (i) laminating to a receptor surface a photopolymerizable element comprising, in order:
      (a) a support;
      (b) an uncolored photosensitive layer comprising a thermally sensitive material; wherein the thermally sensitive material is (i) incompatible with the photosensitive composition, (ii) non-tacky and non-blocking at room temperature, and (iii) tackifiable at 70° C. to 120° C.; wherein layer (c) is in intimate contact with the receptor such that layer (c) adheres to said receptor;
   (ii) imagewise exposing the photopolymerizable element through a transparency and through the support followed by overall exposure of the photopolymerizable element to actinic radiation to form unexposed non-tacky areas and exposed tacky areas on the photosensitive layer;
   (iii) removing the support;
   (iv) developing the photosensitive layer using a dry developer to form a colored image on the receptor surface wherein the photosensitive element is a negative-working, dual exposure, photosensitive composition.

* * * * *